(12) United States Patent
Nanjo

(10) Patent No.: US 7,459,767 B2
(45) Date of Patent: Dec. 2, 2008

(54) SEMICONDUCTOR DEVICE INCLUDING SEMICONDUCTOR MEMORY ELEMENT AND METHOD FOR PRODUCING SAME

(75) Inventor: Masatoshi Nanjo, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 11/435,919

(22) Filed: May 18, 2006

(65) Prior Publication Data

US 2006/0208329 A1 Sep. 21, 2006

Related U.S. Application Data

(62) Division of application No. 11/110,859, filed on Apr. 21, 2005.

(30) Foreign Application Priority Data

Apr. 30, 2004 (JP) .............................. 2004-135714

(51) Int. Cl.
*H01L 29/34* (2006.01)
(52) U.S. Cl. .............................. 257/617; 257/E29.108; 438/459
(58) Field of Classification Search ................ 29/25.01; 257/617, E29.106, E29.108, E21.214, E21.23, 257/E21.237, E21.483; 438/113–115, 459, 438/690–693
See application file for complete search history.

(56) References Cited

U.S. PATENT DOCUMENTS

| | | | | |
|---|---|---|---|---|
| 4,782,029 A | * | 11/1988 | Takemura et al. | 438/472 |
| 5,162,241 A | * | 11/1992 | Mori et al. | 438/402 |
| 5,242,862 A | * | 9/1993 | Okabe et al. | 438/268 |
| 2004/0224469 A1 | * | 11/2004 | Lim et al. | 438/285 |
| 2005/0227498 A1 | * | 10/2005 | Furukawa et al. | 438/758 |

OTHER PUBLICATIONS

Chen, Jian and De Wolf, Ingrid. Semicond. Sci. Technol. vol. 18 (2003): 261-268.*
Haapalinna, Atte; Nevas, Saulius and Pahler, Dietmar. Mater. Sci. Eng. B. vol. 107 (2004): 321-331.*
Zarudi, I. and Zhang, L.C. "Effect of Ultraprecision Grinding on the Microstructural Change in Silicon Monocrystals." J. Mater. Proc. Technol., vol. 84 (1998): pp. 149-158.*
Pei, Z.J. "A Study on Surface Grinding of 300 mm Silicon Wafers." Int. J. Machine Tools & Manu., vol. 42 (2002): pp. 385-393.*

(Continued)

*Primary Examiner*—Douglas M. Menz
*Assistant Examiner*—Matthew W Such
(74) *Attorney, Agent, or Firm*—Smith, Gambrell & Russell, LLP

(57) ABSTRACT

A wafer, in which a plurality of rectangular regions are defined on the face of the wafer by streets arranged in a lattice pattern, and a semiconductor memory element is disposed in each of the rectangular regions, is divided along the streets to separate the rectangular regions individually, thereby forming a plurality of semiconductor devices. Before the wafer is divided along the streets, a strained layer having a thickness of 0.20 μm or less, especially 0.05 to 0.20 μm, is formed in the back of the wafer. The strained layer is formed by grinding the back of the semiconductor wafer by a grinding member formed by bonding diamond abrasive grains having a grain size of 4 μm or less by a bonding material.

2 Claims, 2 Drawing Sheets

OTHER PUBLICATIONS

Pei, Z.J., et. al. "Grinding Induced Subsurface Cracks in Silicon Wafers." Int. J. Machine Tools & Manu., vol. 39 (1999): pp. 1103-1116.*

Li, Y. and Dunyluk, S. "Dynamic Measurements of Damage Generation in Single Crystal Silicon Due to Sliding Contact with a Sperical Diamond." Wear, vol. 200 (1986): pp. 238-243.*

* cited by examiner

SEMICONDUCTOR DEVICE INCLUDING SEMICONDUCTOR MEMORY ELEMENT AND METHOD FOR PRODUCING SAME

CROSS REFERENCE TO RELATED APPLICATION

This application is a division of Ser. No. 11/110,859, filed Apr. 21, 2005 and which is being incorporated in its entirety herein by reference.

FIELD OF THE INVENTION

This invention relates to a semiconductor device including a semiconductor memory element, such as DRAM (dynamic random access memory) or a flash memory, and a method for producing the semiconductor device.

DESCRIPTION OF THE PRIOR ART

In the production of a semiconductor device, as is well known among people skilled in the art, a plurality of rectangular regions are defined by streets arranged in a lattice pattern on the face of a semiconductor wafer, and a semiconductor element is disposed in each of the plural rectangular regions. Then, the back of the wafer is ground to decrease the thickness of the wafer. Then, the wafer is cut along the streets to separate the plural rectangular regions individually, thereby forming semiconductor devices. In a mode called dicing before grinding, the wafer is not completely cut along the streets, but grooves of a required depth are formed in the wafer along the streets, and then the back of the wafer is ground to bring the thickness of the wafer into agreement with the depth of the grooves, whereby the rectangular regions are separated individually to produce semiconductor devices.

In recent times, semiconductor devices have become compact and lightweight. Thus, it is often demanded that the thickness of the semiconductor device be rendered 100 µm or less and, further, 50 µm or less. When the back of the semiconductor wafer is ground, a strained layer is generated in the back of the semiconductor device owing to the grinding. Such a strained layer decreases the transverse rupture resistance of the semiconductor device. If the semiconductor device is brought to such a small thickness, the above strained layer, if left unchanged, would result in insufficient transverse rupture resistance of the semiconductor device. Hence, if the thickness of the semiconductor device is to be rendered that thin, it is usual practice to apply polishing or etching to the ground back of the semiconductor wafer, thereby removing the strained layer, before separating the semiconductor wafer into individual rectangular regions. By so doing, excessively low transverse rupture resistance of the semiconductor device is avoided.

Studies by the inventors have shown that in the case of a semiconductor device including a memory element, such as DRAM or a flash memory, if the strained layer is removed by polishing or etching after the back of the semiconductor wafer is ground, the function of the memory element is deteriorated. The reason is not entirely clear, but the inventors presume that upon removal of the strained layer, a gettering sink effect ascribed to the strained layer is eliminated, with the result that impurities, such as heavy metals, are returned to the neighborhood of the face of the semiconductor wafer.

SUMMARY OF THE INVENTION

It is a first object of the present invention, therefore, to improve a semiconductor device including a memory element, thereby imparting sufficient transverse rupture resistance without inducing the deterioration of a memory function even if the thickness of the semiconductor device is sufficiently small.

It is a second object of the present invention to provide a method for producing a semiconductor device including a memory element, the semiconductor device having sufficient transverse rupture resistance without inducing the deterioration of a memory function even if the thickness of the semiconductor device is sufficiently small.

The inventors diligently conducted studies and experiments, and have found that if a strained layer considerably thinner than a conventional strained layer is intentionally rendered present in the back of a semiconductor device, sufficient transverse rupture resistance can be imparted without deterioration of the function of a memory element.

That is, according to a first aspect of the present invention, there is provided, as a semiconductor device including a semiconductor memory element which attains the above-mentioned first object, a semiconductor device including a semiconductor memory element, wherein a strained layer having a thickness of 0.20 µm or less has been formed on the back of the semiconductor device.

The thickness of the strained layer is preferably 0.05 µm or more. The strained layer preferably has been generated by grinding the back of the semiconductor device by a grinding member formed by bonding diamond abrasive grains having a grain size of 4 µm or less by a bonding material.

According to a second aspect of the present invention, there is provided, as a method for producing a semiconductor device which attains the above-mentioned second object, a method for producing a semiconductor device, comprising dividing a wafer, in which a plurality of rectangular regions are defined on the face of the wafer by streets arranged in a lattice pattern, and a semiconductor memory element is disposed in each of the rectangular regions, along the streets to separate the rectangular regions individually, thereby forming a plurality of semiconductor devices, the method further comprising forming a strained layer having a thickness of 0.20 µm or less on the back of the wafer before dividing the wafer along the streets.

The thickness of the strained layer is preferably 0.05 µm or more. It is preferred to form the strained layer by grinding the back of the semiconductor wafer by a grinding member formed by bonding diamond abrasive grains having a grain size of 4 µm or less by a bonding material.

DETAILED DESCRIPTION OF THE PREFERRED EMBODIMENTS

Figure 1:
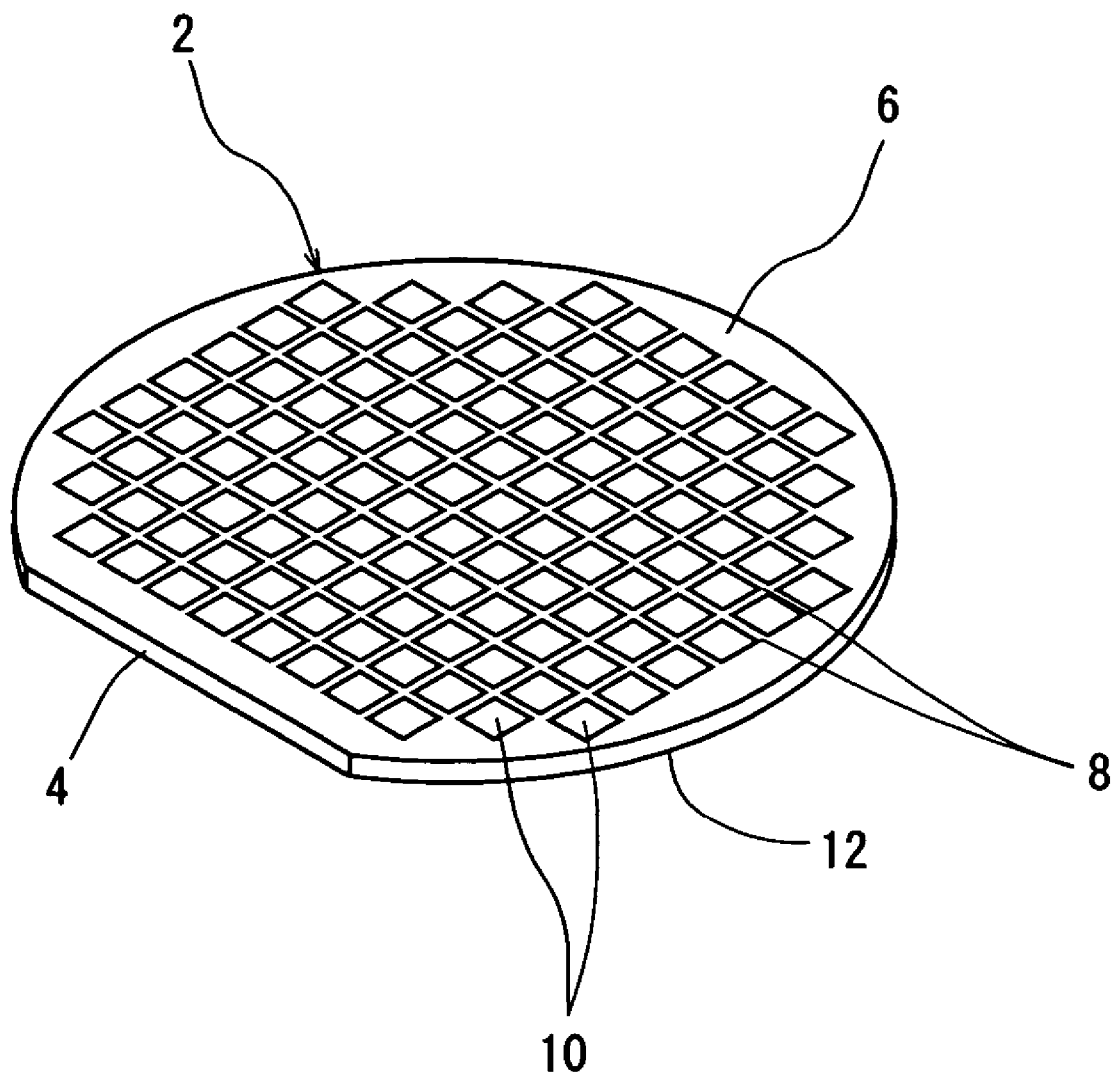
FIG. 1 is a perspective view showing a typical example of a wafer to which a preferred embodiment of a manufacturing method according to the present invention is applied.

FIG. 1 shows a wafer to which a preferred embodiment of a manufacturing method according to the present invention is applied. A wafer, entirely indicated at a numeral 2, is formed of silicon, and is circular except an orientation flat 4. On the face 6 of the wafer 2, a plurality of rectangular regions 10 are defined by streets 8 arranged in a lattice pattern. A semiconductor element including a memory element, such as DRAM or flash memory, is formed in each of the rectangular regions 10. Since such a wafer 2 per se is well known among people skilled in the art, its detailed explanation is omitted herein.

Figure 2:
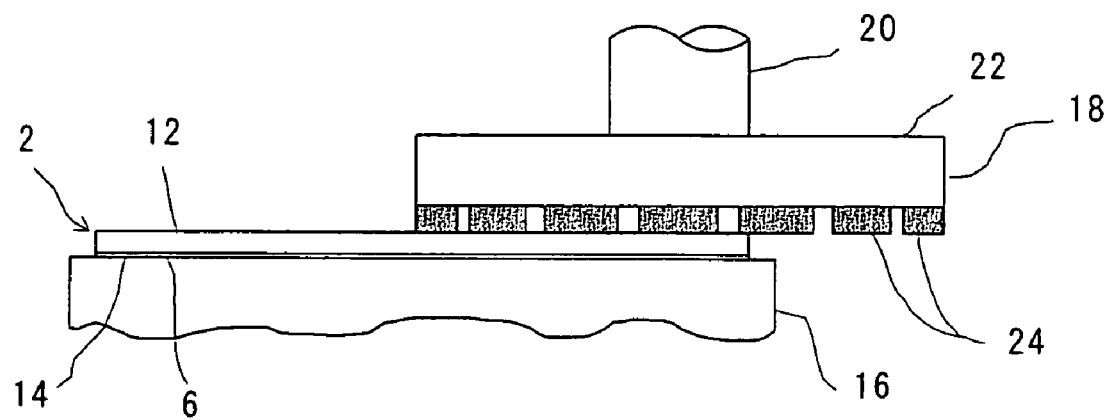
FIG. 2 is a schematic view showing a state in which the back of the wafer is ground in the preferred embodiment of the manufacturing method of the present invention.
Figure 3:
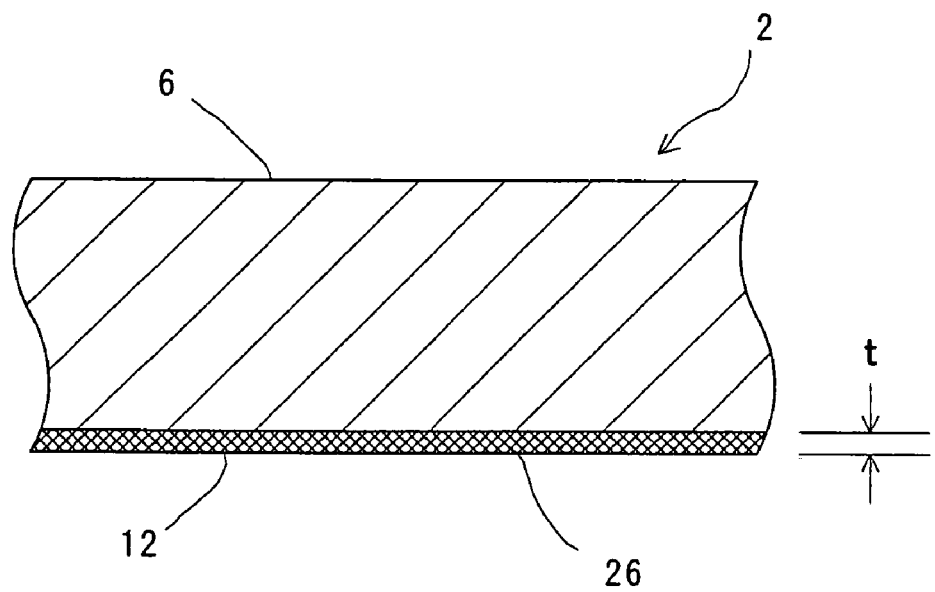
FIG. 3 is a partial sectional view showing a preferred embodiment of a semiconductor device according to the present invention.

In the present invention, it is important to grind the back 12 of the wafer 2, thereby forming a strained layer of a required thickness on the back of the wafer 2. FIG. 2, which shows the manner of grinding the back 12 of the wafer 2, is referred to for the purpose of explanation. Before grinding the back 12 of the wafer 2, a suitable protective sheet 14 is pasted to the face 6 of the wafer 2. The wafer 2, which has the suitable protective sheet 14 pasted to the face 6 thereof, is rendered facedown, and placed on a chuck means 16. The chuck means 16, which is rotated about its central axis extending substantially vertically, has a substantially horizontal upper surface, and many suction holes (not shown) are formed in this upper surface. The wafer 2 is placed on the upper surface of the chuck means 16, and the suction holes are brought into communication with a vacuum source (not shown), whereby the wafer 2 is attracted onto the upper surface of the chuck means 16. A grinding means 18 is caused to act on the back 12 of the wafer 2. The grinding means 18 includes a support disk 22 fixed to a rotating shaft 20 extending substantially vertically. To a peripheral edge portion of the lower surface of the support disk 22, a plurality of arcuate grinding members 24 are fixed with spacing in the circumferential direction. Instead of the plural arcuate grinding members 24, a single grinding member extending continuously in a toroidal form can be fixed to the support disk 22. In grinding the back 12 of the wafer 2, the chuck means 16 is rotated, and the grinding means 18 is rotated at the same time. The grinding member 24 of the grinding means 18 is pressed against the back 12 of the wafer 2, and the grinding means 18 is moved in a horizontal direction with respect to the chuck means 16. When the back 12 of the wafer 2 is ground in this manner to decrease the thickness of the wafer 2 to a required value, microcracks are formed in the back 12 of the wafer 2 owing to the grinding, and such microcracks constitute a strained layer 26 (FIG. 3). In FIG. 3, the wafer 2 stripped of the protective sheet 14 from its face 6 is illustrated in an upright state, and the strained layer 26 constituted of the microcracks formed in the back 12 is indicated by cross-hatching.

In the present invention, it is important to form the strained layer 26 having a thickness t of 0.20 µm or less, preferably 0.05 to 0.20 µm, on the back 12 of the wafer 2. To form the strained layer 26 of such a markedly small thickness, it is recommendable, according to the inventors' experience, to use the grinding member 24 formed by bonding diamond grains having a grain size of 4 µm or less by a suitable bonding material such as a vitrified bond or a resin bond. The thickness t of the strained layer 26 constituted of the microcracks can be measured by observing the back 12 of the wafer 2 under a transmission electron microscope.

In the above-described manner, the back 12 of the wafer 2 is ground to form the strained layer 26 of the required thickness. Then, the wafer 2 is separated along the streets 8, whereby a semiconductor device composed of each of the rectangular regions 10 is completed. To separate the wafer 2 along the streets 8, it suffices to cut the wafer 2 along the streets 8 by a dicer well known per se.

If desired, prior to grinding of the back 12 of the wafer 2, it is possible to cut the wafer 2 along the streets 8 to a predetermined depth from the face 6 of the wafer 2, thereby forming grooves in the face 6 of the wafer 2 along the streets 8, and then grind the back 12 of the wafer 2, thereby decreasing the thickness of the wafer 2 to the depth of the grooves. By this procedure, the rectangular regions 10 can be separated individually.

EXAMPLE

A silicon wafer of a shape as shown in FIG. 1 was rendered ready for use. The diameter of the wafer was 8 inches, and its thickness was 725 µm. On the face of the wafer, 750 rectangular regions were defined. Each of the rectangular regions measured 5×8 mm, and DRAM was formed in each of the rectangular regions. The back of such a wafer 2 was ground in a manner as shown in FIG. 2 to decrease the thickness of the wafer 2 to 150 µm. A grinding member used was formed from diamond grains having a grain size of 4 µm or less bonded by a vitrified bond. Then, the wafer was cut along the streets to produce a semiconductor device comprising the rectangular region separated individually. Observation of the back of the semiconductor device by a transmission electron microscope showed that a strained layer having a thickness of 0.15 to 0.19 µm and constituted of microcracks was formed in the back of the semiconductor device. The transverse rupture resistance of the semiconductor device was measured. The results are shown in Table 1. The transverse rupture resistance of the semiconductor device was measured by a ball transverse rupture method comprising placing the semiconductor device on a cylindrical jig, and pressing a ball against the center of the semiconductor device. Furthermore, a manufacturer of DRAM was asked to test the memory function of the semiconductor device. The results of the test are shown in Table 1.

Comparative Example 1

A semiconductor device was produced in the same manner as in the above Example, except that the grinding member was formed from diamond grains having a grain size of 4 to 6 µm. The back of the semiconductor device was observed by a transmission electron microscope. It was found that a strained layer having a thickness of nearly 0.50 to 1.00 µm and constituted of microcracks was formed in the back of the semiconductor device. The transverse rupture resistance of the semiconductor device was measured. The results are shown in Table 1. Furthermore, a manufacturer of DRAM was asked to test the memory function of the semiconductor device. The results of the test are shown in Table 1.

Comparative Example 2

A semiconductor device was produced in the same manner as in Comparative Example 1, except that after the back of the wafer was ground, the back of the wafer was polished over a thickness of 1.20 µm with the use of a polishing tool sold by DISCO CORP. under the trade name of "DRY POLISH". When the back of the semiconductor device was observed by a transmission electron microscope, it was found that a strained layer substantially did not exist in the back of the semiconductor device. The transverse rupture resistance of the semiconductor device was measured. The results are shown in Table 1. Furthermore, a DRAM manufacturer was asked to test the memory function of the semiconductor device. The results of the test are shown in Table 1.

TABLE 1

|  | Thickness of strained layer (μm) | Transverse rupture resistance (MPa) | Decline in memory function |
|---|---|---|---|
| Example | 0.15-0.19 | 910 | No |
| Comparative Example 1 | 0.50-1.00 | 620 | No |
| Comparative Example 2 | Zero | 920 | Yes |

I claim:

1. A semiconductor device including:

a semiconductor memory element; and a strained layer having a thickness of from 0.15 μm to 0.19 μm on a back of the semiconductor device, wherein the stained layer is constituted by microcracks, wherein the strained layer is generated by grinding the back surface of the semiconductor device with a grinding member, wherein the semiconductor device has a transverse rupture resistance provided by the strained layer, and wherein the transverse rupture resistance is 910 MPa.

2. The semiconductor device including a semiconductor memory element according to claim 1, wherein the grinding member is formed by bonding diamond abrasive grains having a grain size of 4 μm or less by a bonding material, thereby generating said strained layer having a thickness of from 0.15 μm to 0.19 μm on the back of the semiconductor device.

* * * * *